(12) United States Patent
Boor

(10) Patent No.: US 12,726,762 B2
(45) Date of Patent: Sep. 1, 2026

(54) SENSOR COMPONENT WITH IMPROVED OVERLOAD AND INTERFERENCE IMMUNITY PERFORMANCE

(71) Applicant: Knowles Electronics, LLC, Itasca, IL (US)

(72) Inventor: Steven E. Boor, Plano, TX (US)

(73) Assignee: Knowles Electronics, LLC, Itasca, IL (US)

( * ) Notice: Subject to any disclaimer, the term of this patent is extended or adjusted under 35 U.S.C. 154(b) by 145 days.

(21) Appl. No.: 18/948,613

(22) Filed: Nov. 15, 2024

(65) Prior Publication Data

US 2026/0143280 A1 May 21, 2026

(51) Int. Cl.
*H04R 3/00* (2006.01)
*H03F 3/183* (2006.01)

(52) U.S. Cl.
CPC .............. *H04R 3/00* (2013.01); *H03F 3/183* (2013.01); *H03F 2200/03* (2013.01); *H04R 2201/003* (2013.01)

(58) Field of Classification Search
CPC .... H04R 3/00; H04R 19/04; H04R 2201/003; H04R 3/02; H04R 3/04; H04R 1/04; H04R 19/005; H04R 17/02; H04R 23/008; H04R 1/1083; H04R 3/06; H04R 5/00; H04R 3/002; H04R 5/027; H04R 1/02; H04R 1/028; H04R 1/1016; H04R 1/1066; H04R 1/14; H04R 2201/107; H04R 25/356; H04R 25/402; H04R 25/502; H04R 5/0335; G10H 1/0091; G10H 2210/285; G10H 2230/035; G10H 2240/275; G10H 3/20; G10H 7/004; G10K 15/10; G10K 11/17825; G10K 11/17853; G10K 11/17857; G10K 11/17873; G10K 11/17875; G10K 11/17885
USPC ................. 381/98, 92, 56–58, 120; 330/129
See application file for complete search history.

(56) References Cited

U.S. PATENT DOCUMENTS

| | | | |
|---|---|---|---|
| 9,282,406 | B2 | 3/2016 | Bogason et al. |
| 9,743,167 | B2 | 8/2017 | Nielsen et al. |
| 10,559,293 | B2 | 2/2020 | Thomsen et al. |
| 10,887,712 | B2 | 1/2021 | Berthelsen et al. |
| 11,095,990 | B2 | 8/2021 | Hansen et al. |
| 11,142,451 | B2 | 10/2021 | Furst et al. |
| 11,254,560 | B2 | 2/2022 | Tingleff et al. |
| 11,284,202 | B2 | 3/2022 | Korishe et al. |
| 11,536,757 | B2 | 12/2022 | Jennings et al. |
| 11,897,762 | B2 | 2/2024 | Bharadwaj et al. |

(Continued)

*Primary Examiner* — Lun-See Lao
(74) *Attorney, Agent, or Firm* — Hickman Becker Bingham Ledesma LLP; Matthew Loppnow

(57) ABSTRACT

A sensor component is disclosed including a transducer and an electrical circuit disposed in a housing. The electrical circuit includes a bias voltage source coupled to a first electrode of the transducer. A non-inverting amplifier stage is coupled to a second electrode of the transducer. An inverting amplifier stage is coupled to an output of the non-inverting amplifier stage. A negative feedback path is located between an output of the inverting amplifier stage and the first electrode of the transducer. An electrical output signal of the transducer can be attenuated by applying an attenuation signal, based on a filtered electrical signal, to the first electrode via the negative feedback path.

19 Claims, 7 Drawing Sheets

(56) References Cited

U.S. PATENT DOCUMENTS

2010/0150366 A1* 6/2010 Davidson ......... G10K 11/17857
381/71.1
2010/0310096 A1* 12/2010 Josefsson ................. H04R 3/06
381/113
2011/0158435 A1* 6/2011 Ono ...................... H03F 1/0261
330/260
2013/0271307 A1* 10/2013 Kropfitsch ............. H03G 3/002
341/158
2017/0077911 A1 3/2017 Badillo et al.
2021/0360347 A1* 11/2021 Aschieri ................. H03F 3/183
2023/0112042 A1* 4/2023 Toft ...................... B81B 3/0056
381/93
2024/0217810 A1 7/2024 Jennings et al.

* cited by examiner

| Legend | |
|---|---|
| 6 dB Attn. | 9.202% THD |
| 3 dB Attn. | 6.484% THD |
| 0 dB Attn. | 11.33% THD |
| Reference Signal(Gold) | |
| Input = 600mVpk(~122 dBSPL) | DC Average = 450mV |
| Attenuation Threshold = +/- 200mV | |

SENSOR COMPONENT WITH IMPROVED OVERLOAD AND INTERFERENCE IMMUNITY PERFORMANCE

FIELD OF THE DISCLOSURE

The present disclosure relates generally to sensor components and more particularly to sensor components having improved overload performance, and electrical circuits for such components.

BACKGROUND

Microelectromechanical systems (MEMS) microphone components comprising a transducer and an ASIC packaged in a housing with a device interface are known generally and deployed in ear-worn hearing devices, consumer electronics, durable goods, equipment, and other host systems. These and other microphones include a capacitive MEMS motor or other transducer that generates an electrical output signal in response to detected acoustic signals. The electrical output signal is buffered or amplified at a frontend of the ASIC before any further signal processing and output at the device interface. However large amplitude electrical signals generated by the transducer can overload the frontend of the ASIC, adversely affecting acoustic overload point (AOP) performance of the microphone. AOP is typically defined in the hearing health industry as an input sound pressure level (dB SPL) at which total harmonic distortion (THD) of the microphone output signal reaches 10% at 1 kHz. Additionally, some amplifiers commonly used to mitigate intermodulation distortion (IMD) in MEMS microphones can adversely affect AOP performance. Thus, there is an ongoing need for microphone and other sensor components having improved overload performance and electrical circuits for such sensors.

BRIEF DESCRIPTION OF THE DRAWINGS

The objects, features and advantages of the present disclosure will become more fully apparent upon consideration of the following detailed description and appended claims in conjunction with the accompanying drawings. The drawings depict only representative embodiments and implementations and are not considered to limit the teaching of the disclosure, the scope of which is set forth by the appended claims.

Those of ordinary skill in the art will appreciate that the drawings are illustrated for simplicity and clarity and therefore may not be drawn to scale and may not include well-known features, that the order of occurrence of actions or steps may be different than the order described, that some or all of such actions or steps may be performed concurrently unless specified otherwise, and that the terms and expressions used herein have meaning understood by those of ordinary skill in the art except where a different meaning is specifically attributed to them herein.

DETAILED DESCRIPTION

The disclosure relates generally to sensor components and more particularly to sensor components having improved acoustic overload point (AOP) performance, and electrical circuits for such sensor components. Acoustic sensor components including microphones and vibration sensors are commonly integrated with ear-worn hearing devices, cell phones, personal computers, televisions, and smart-speakers among many other consumer devices. These and other sensor components are also integrated in vehicles and appliances, durable goods, machinery, and equipment, among other hosts.

Figure 1:
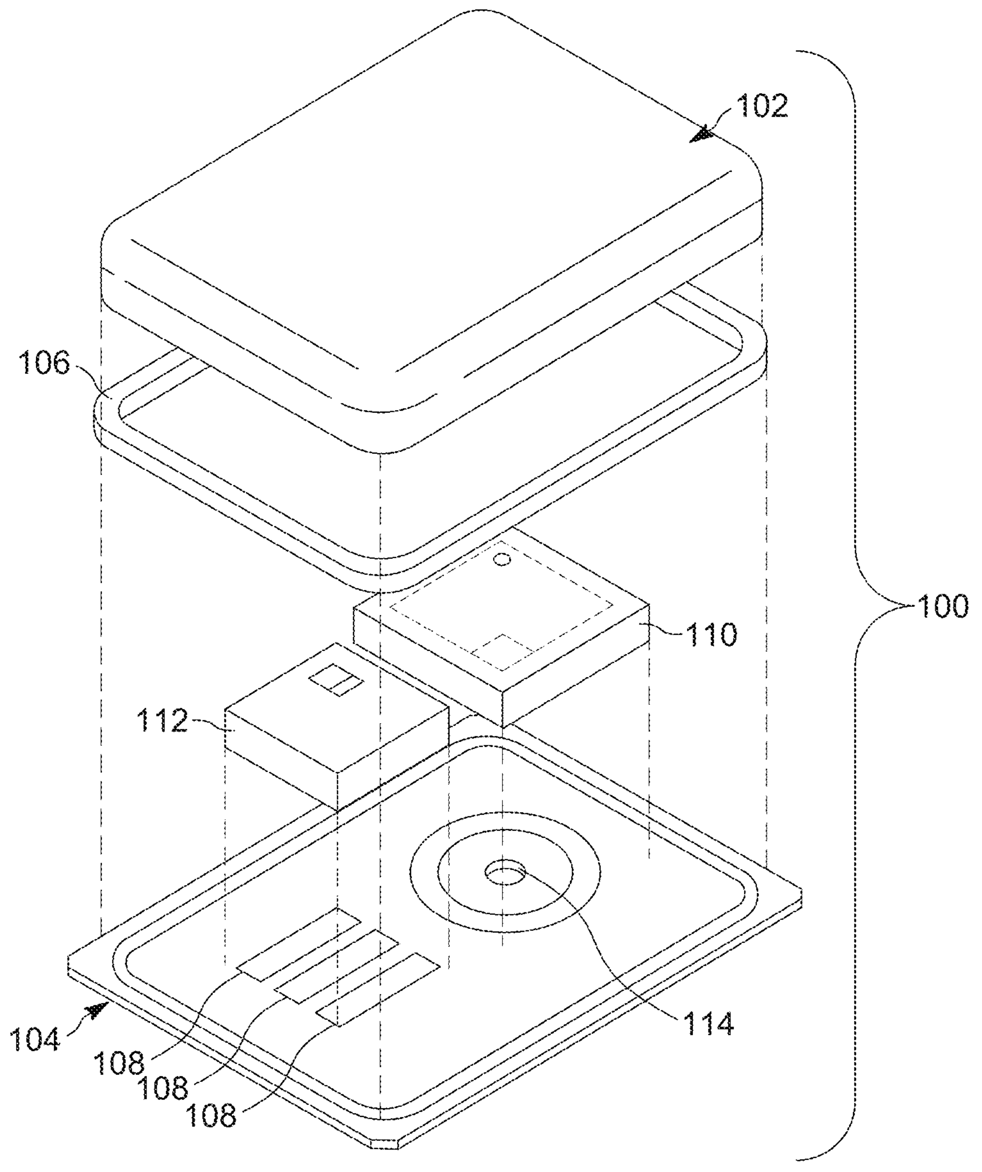
FIG. 1 is an exploded view of a representative sensor component.

The sensor component generally comprises a transducer and an electrical circuit disposed in a housing having an external electrical interface. In FIG. 1, a representative sensor 100 comprises a housing having a cover 102 mounted on a base 104. A guard ring 106 is optionally located between the cover and substrate. The cover, guard ring and base can comprise conductive materials to electrically shield the transducer and electrical within the housing. The cover can be a metal can or metallized PCB materials. The base can also be a PCB or other substrate comprising one or more layers.

The transducer is electrically coupled to the electrical circuit and the electrical circuit is electrically coupled to the external electrical interface of the housing. The transducer generally comprises one or more electrodes (e.g., a membrane or diaphragm) movable relative to a fixed electrode. Deflection of the movable electrode relative to the fixed electrode in response to a sensed condition provides a basis for generating an electrical signal representing the sensed condition. Representative transducers include a capacitive microelectromechanical systems (MEMS) device, also referred to as a MEMS die or MEMS motor, electret capacitive motors (ECMs), piezoelectric devices and photocells, among other devices having fixed and movable electrodes. The electrical circuit can be implemented as one or more integrated circuits (ICs) or application specific ICs (ASICs).

Figure 2:
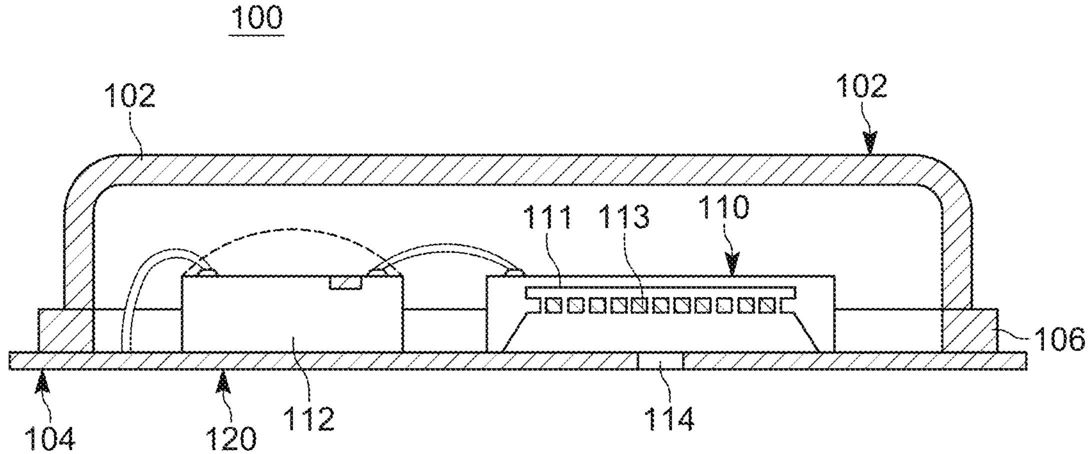
FIG. 2 is a sectional view of the sensor of FIG. 2.

In FIGS. 1 and 2, the representative sensor component 100 is implemented as a microphone comprising an acoustic transducer 110 is disposed over an acoustic port 114 in the base 104. In FIG. 2, the transducer 110 comprises a diaphragm 111 movable relative to a perforated backplate 113 in response to changes in acoustic pressure entering an interior of the housing via the sound port 114. Alternatively, the acoustic transducer can be disposed over an acoustic port in the cover. In still other implementations, the sensor is a vibration sensor or accelerometer devoid of an acoustic port in the housing. The transducer of a vibration sensor or accelerometer can be implemented as a proof mass. Other implementations include sensor components for detecting gas among other conditions.

In FIG. 1, an IC 112 is disposed in the housing and electrically connected to contacts 108 on the base. In FIG. 2, the MEMS transducer 110 is wire bonded to the IC 112 and the IC is wire bonded to contacts on the base. Alternatively, the IC can be surface mounted on the contacts. The contacts on the base can be electrically connected to the electrical interface 120 on the exterior of the housing by vias extending through base. Alternatively, the IC can be mounted on some other surface of the housing interior, like the cover, and connected to the electrical interface vias conductors extending through the side walls or other structure of the housing.

The electrical circuit generally comprises a bias voltage source coupled to a first electrode of the transducer, a non-inverting amplifier stage having an input coupled to a second electrode of the transducer, an inverting amplifier stage coupled to an output of the non-inverting amplifier stage, a negative feedback path between an output of the inverting amplifier stage and the first electrode of the transducer, and a filter configured to filter an electrical signal of the electrical circuit. An electrical output signal of the transducer can be attenuated by a negative feedback (attenuation) signal applied to the first electrode via the negative feedback path, wherein the attenuation signal is based on the filtered electrical signal. In some implementations, the attenuation signal is selectively applied to the transducer based on a signal detected at the input of the inverting amplifier stage. Thus configured the sensor can detect signals of interest without interference by other signals. Representative electrical circuits are described herein.

Figure 3:
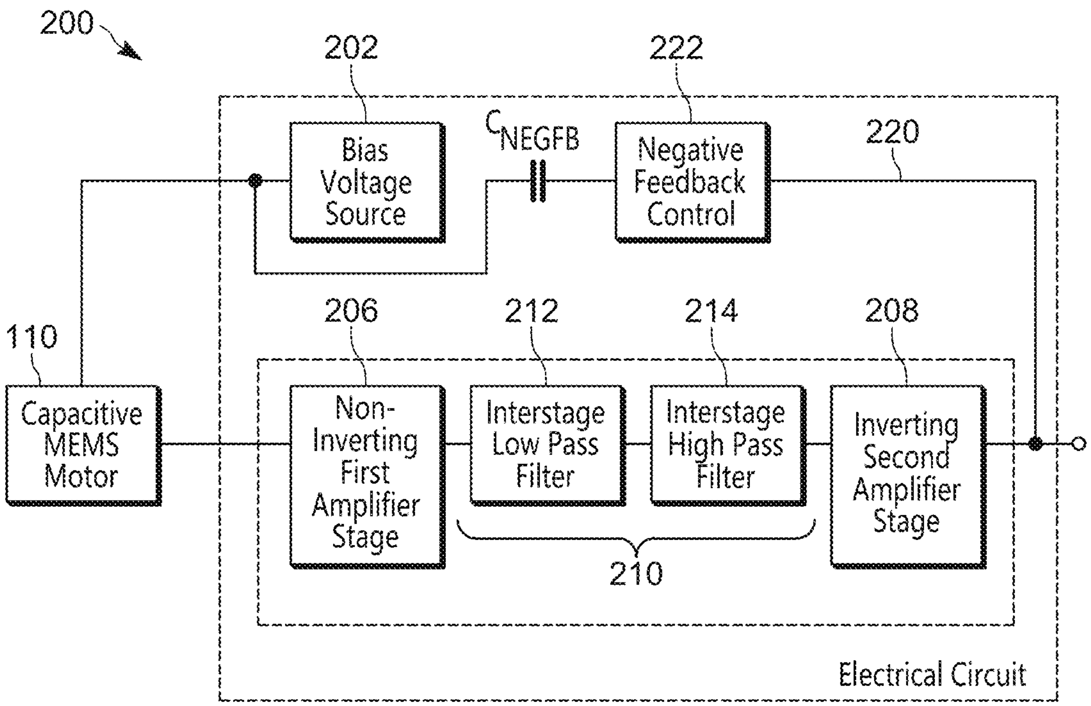
FIG. 3 is a block diagram of a representative electrical circuit for a sensor component.
Figure 4:
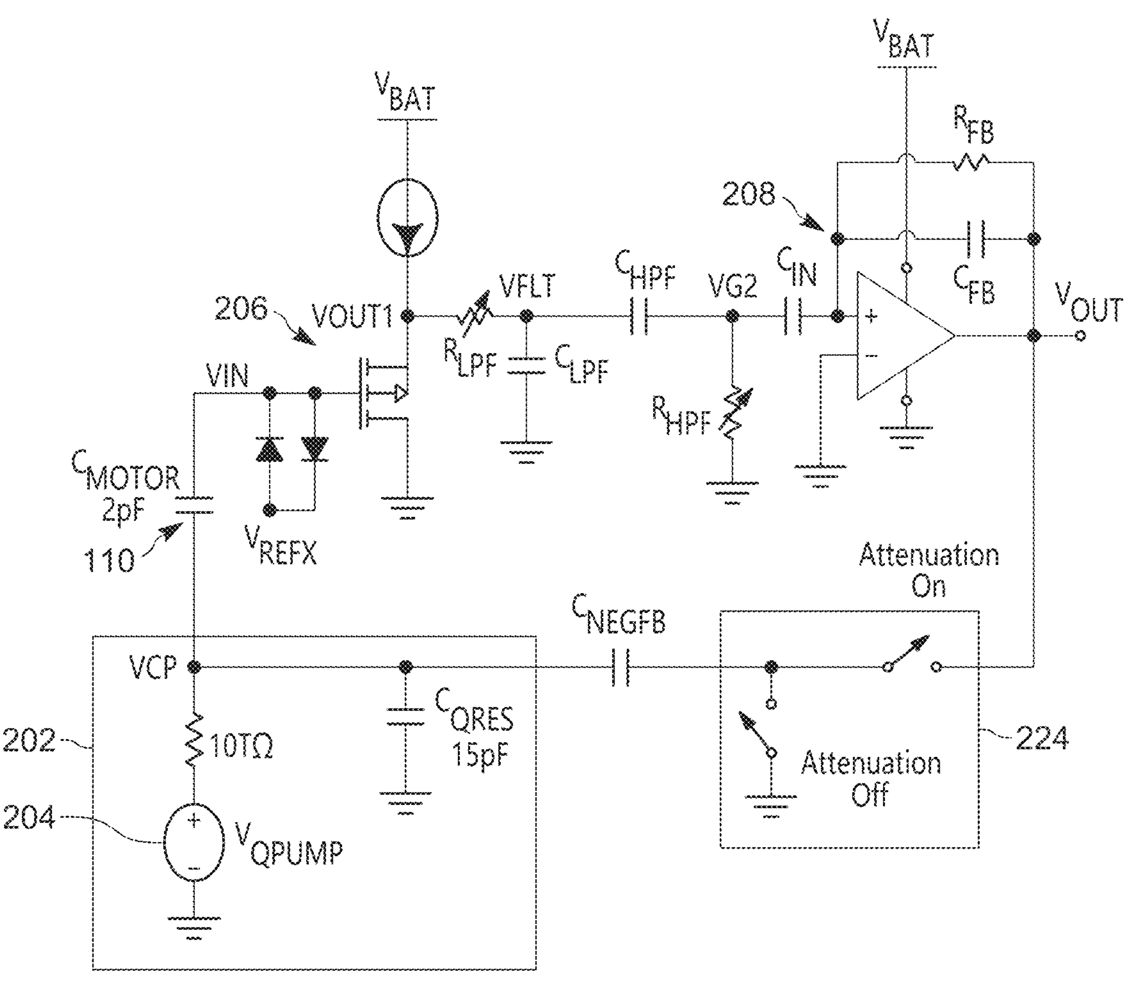
FIG. 4 is a representative electrical circuit implementation of the block diagram of FIG. 3.
Figure 6:
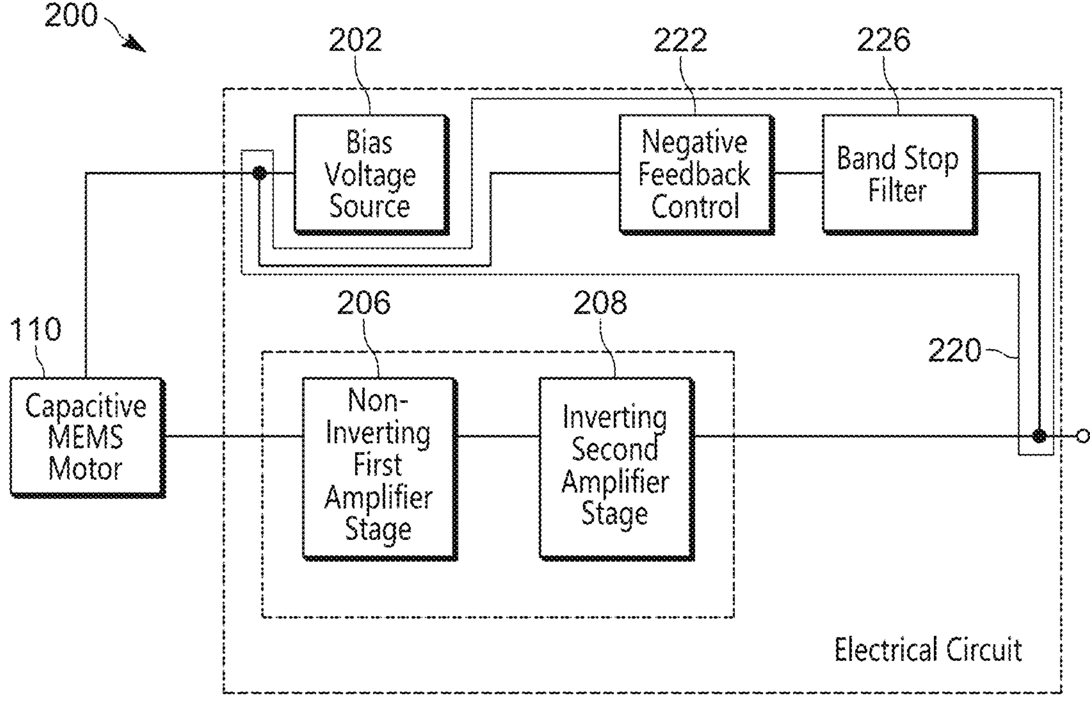
FIG. 6 is a block diagram of an alternative electrical circuit for a sensor component.
Figure 7:
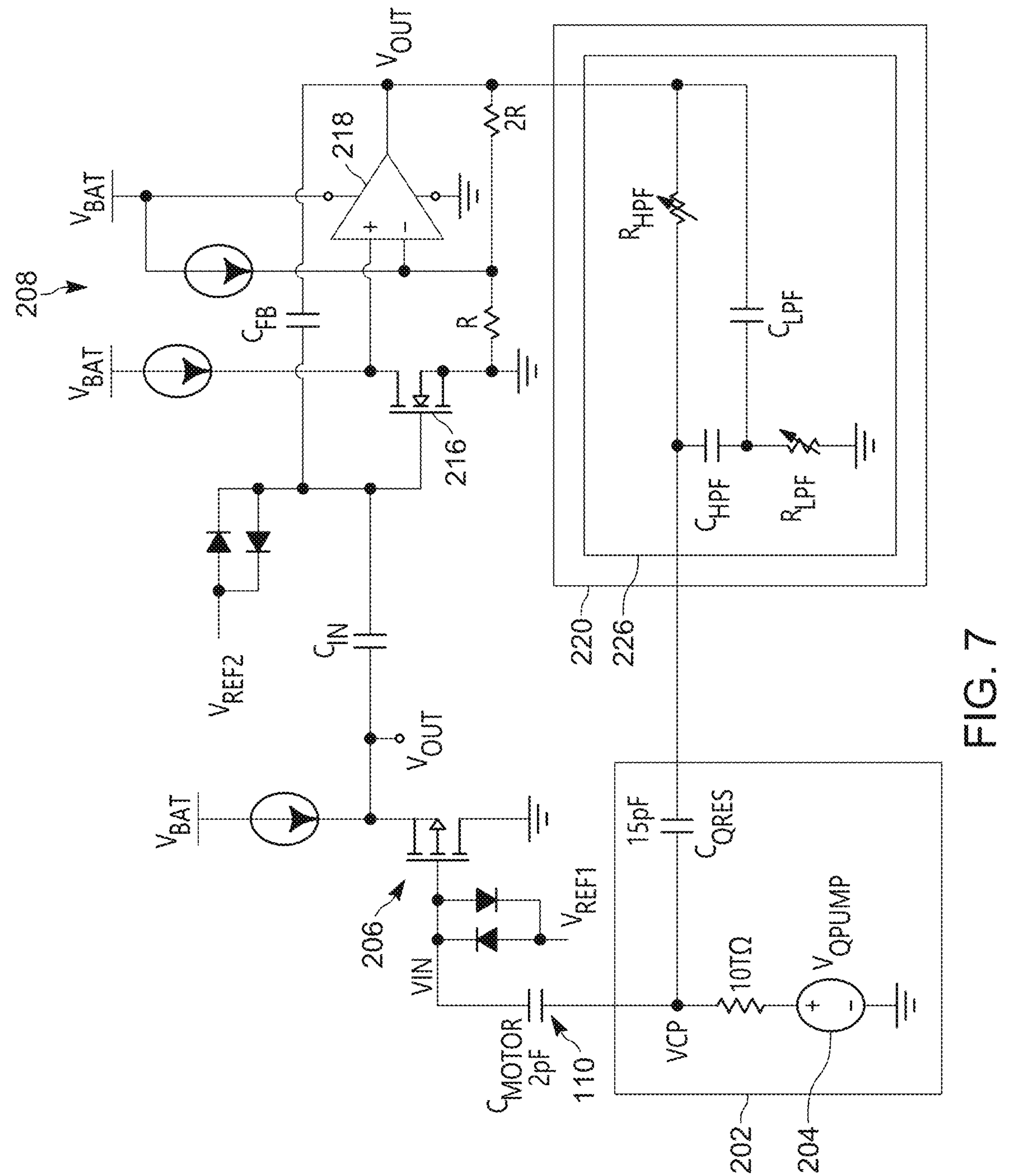
FIG. 7 is a representative circuit implementation of the block diagram of FIG. 6.

In FIGS. 3 and 6, an electrical circuit 200 comprises a bias voltage source 202 coupled to a transducer 110. In FIGS. 4 and 7, a representative bias voltage source 202 comprises multi-stage charge pump 204 having a low pass filter (LPF) on an output coupled to the first electrode of the transducer 110. The representative LPF of the charge pump provides a high output impedance and comprises a 10 TΩ equivalent resistance coupled to a 15 pF capacitor $C_{QRES}$. Other resistor and capacitor values can be used alternatively.

In FIGS. 3 and 6, a non-inverting amplifier stage 206 is coupled to the transducer 110. In FIGS. 4 and 7, an input $V_{IN}$ of the non-inverting amplifier 206 is coupled to the second electrode of the transducer 110. The representative transducer 110 is a capacitive motor $C_{MOTOR}$. A high impedance interface of the non-inverting amplifier stage can limit charge leakage from the capacitive motor $C_{MOTOR}$ coupled to the input $V_{IN}$. A pair of reverse polarity diodes connected in parallel between the input $V_{IN}$ and a reference voltage $V_{REFX}$ provides the high impedance at the input $V_{IN}$. The input impedance is on the order of 100 TΩ, for example 300 TΩ. The non-inverting amplifier stage 206 in FIG. 4 is implemented as a PMOS device. Alternatively, the non-inverting amplifier stage can be implemented as an NMOS device, among other low current devices.

Figure 5:
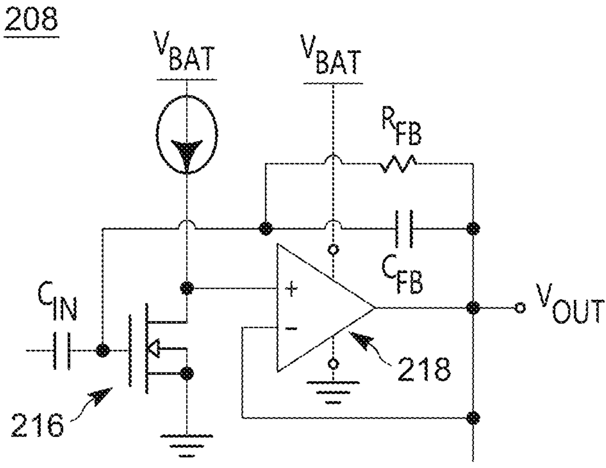
FIG. 5 is a representative alternative inverting amplifier stage for the electrical circuit of FIG. 4.

In FIGS. 3 and 4, the non-inverting amplifier stage 206 is coupled to an inverting amplifier stage 208 by a filter network described further herein. In FIG. 5, an alternative inverting amplifier stage comprises an inverting amplifier 216 coupled to an output driver 218. A gain of the inverting amplifier stages 208 of FIGS. 4 and 5 is based on a ratio of an input capacitor $C_{IN}$ and a feedback capacitor $C_{FB}$. A feedback resistor $R_{FB}$ provides a DC bias for the inverting amplifier stage 208. The feedback resistor $R_{FB}$ can be selected to provide a flat frequency response. For example, a flat audio response can be obtained when $R_{FB}$ is 800 MΩ and capacitor $C_{IN}$ is approximately 10 pf. Other resistor and capacitor values can also provide a flat response in this and other sensor implementations, depending on the desired gain. The inverting amplifier is implemented as an NMOS device. Alternatively, the inverting amplifier can be implemented as a PMOS device, among other low current devices.

In another alternative implementation, the inverting amplifier could be replaced with a non-inverting amplifier and the output driver could provide the signal inversion.

In FIGS. 6 and 7, the non-inverting amplifier stage 206 is coupled to the inverting amplifier stage 208. In FIG. 7, the inverting amplifier stage comprises an inverting amplifier 216 coupled to a driver 218. A gain of the inverting amplifier stage is based on a ratio of an input capacitor $C_{IN}$ and a feedback capacitor $C_{FB}$. DC bias resistors R and 2R can be selected to provide internal loop gain (1+2R/R) for the driver 218. The internal loop gain of the driver can reduce the signal swing of the inverting amplifier 216 necessary to provide a desired output. The inverting amplifier is implemented as an NMOS device. Alternatively, the inverting amplifier can be implemented as a PMOS device, among other low current devices. Alternatively, the inverting amplifier stage 208 of FIG. 7 can be implemented in the electrical circuit of FIG. 4 and the inverting amplifier stage 208 of FIG. 4 can be implemented in the electrical circuit of FIG. 7.

Generally, the sensor component output signal can be based on the output of the non-inverting amplifier stage or the inverting amplifier stage. In FIGS. 4 and 5, the output $V_{OUT1}$ of the non-inverting amplifier stage 206 or output $V_{OUT}$ of the inverting amplifier stage 208 can be directly coupled to the external electrical interface of the sensor housing. In FIG. 7, similarly, the output $V_{OUT1}$ of the non-inverting amplifier stage 206 or the output $V_{OUT}$ of the driver 218 can be coupled to the electrical interface on an exterior of the sensor housing. But the output of the inverting amplifier stage is out of phase relative to the signal at the input of the non-inverting stage. In some implementations, a switch like a multiplexer can be provided to select the output signal source, depending on the sensor use case. Also, one or more additional signal processing circuits can be coupled to the selected output to further process the output signal upstream of the external electrical interface.

In FIG. 3, the filter network between the non-inverting amplifier stage 206 and the inverting amplifier stage 208 is a bandpass filter (BPF) 210 comprising an interstage low pass filter (LPF) 212 coupled to an interstage high pass filter (HPF) 214. In FIG. 4, the bandpass filter is located between the output $V_{OUT1}$ of the non-inverting amplifier stage 206 and the input of inverting amplifier stage 208. The LPF portion of the BPF comprises a resistor $R_{LPF}$ between the non-inverting output $V_{OUT1}$ and a node $V_{FLT}$ and capacitor $C_{LPF}$ connected between the node $V_{FLT}$ and ground or other voltage reference. The HPF portion of the BPF comprises a capacitor $C_{HPF}$ between node VFLT and a node $V_{G2}$ and a resistor $R_{HPF}$ connected between the node $V_{G2}$ and ground or other voltage reference. The resistors $R_{LPF}$ and $R_{HPF}$ shown are variable to permit adjustment of the filter cutoff frequencies. Alternatively, the resistors can have fixed values while the capacitors can be adjusted. In microphone sensors, the bandpass filter can have a low frequency cutoff between 20 Hz and 200 Hz and a high frequency cutoff between 4 KHz and 20 KHz. In another implementation, the bandpass filter has a low frequency cutoff not more than 300 Hz and a high frequency cutoff not less than 4 KHz. In acoustic vibration sensors, the low and high frequency cutoffs can be selected within a device-specific linear operating range of the sensor. In one implementation, the low frequency cutoff is not more than 300 Hz and the high frequency cutoff is not less than 3 KHz. More generally, the bandpass filter cutoff frequencies can be selected to optimize sensing of other signals depending on the sensor application.

In FIGS. 3 and 4, an output of the inverting amplifier stage 208 is coupled to the transducer 110 to provide a negative feedback path 220. In FIG. 4, the output $V_{OUT}$ of the inverting amplifier stage 208 is coupled to the first terminal of the capacitive motor $C_{MOTOR}$ by a DC blocking capacitor $C_{NEGFB}$. In the alternative inverting amplifier stage of FIG. 5, an output of the driver 218 can be coupled to the capacitive motor $C_{MOTOR}$ by the capacitor $C_{NEGFB}$. In the electrical circuits of FIGS. 3 and 4, the negative feedback (attenuation) signal can be selected to control or adjust sensitivity of the transducer. In FIG. 4, the attenuation factor is based on a ratio of $C_{NEGFB}$ to $C_{QRES}$.

In some implementations, the electrical circuit comprises a feedback control circuit 222 that selectively applies the negative feedback signal to the transducer, as shown in FIGS. 3 and 6. The feedback control circuit controls application of the attenuation signal to the transducer based on detection of one or more signals downstream of the filter between the non-inverting and inverting amplifier stages, for example at node $V_{G2}$. In FIG. 4, the feedback control circuit is implemented by a switch network 224 that selectively enables/disables the attenuation signal. The switch network 224 can be actuated by a controller (shown in FIG. 3) based on one or more signal levels detected (e.g., by a threshold detector) at the input of the inverting amplifier stage 208. The switch can be controlled based on a time average, or other algorithmic analysis, of one or more signal levels detected at the output of the filter network.

In FIGS. 6 and 7, a negative feedback path 220 is located between an output of the inverting amplifier stage 208 and the transducer 110. The output $V_{OUT}$ of the driver 218 is coupled to the capacitive motor $C_{MOTOR}$ by a bandstop filter described further herein. In FIG. 7, the bandstop filter 226 comprises a low pass filter (LPF) and a high pass filter (HPF) network located between the output of the driver 218 and the bottom plate of the $C_{QRES}$ filter capacitor of the bias voltage source 202. The LPF comprises a capacitor $C_{LPF}$ and a resistor $R_{LPF}$ between the output of the driver 218 and ground or other voltage reference. The HPF comprises a resistor $R_{HPF}$ and a capacitor $C_{HPF}$ in parallel with the LPF capacitor $C_{LPF}$. A node between the resistor $R_{HPF}$ and a capacitor $C_{HPF}$ is coupled to the capacitive motor $C_{MOTOR}$ via the capacitor $C_{QRES}$ of the bias voltage source. The resistors $R_{LPF}$ and $R_{HPF}$ are variable to permit adjustment of the filter cutoff frequencies. Alternatively, the resistors can have fixed values and the capacitors can be variable.

In the electrical circuits of FIGS. 6 and 7, the negative feedback (attenuation) signal predominately attenuates signals from the transducer at frequencies outside the rejected band of the bandstop filter. Thus, the low and high cutoff frequencies of the bandstop filter can be selected to optimize transduction of the signals of interest with minimal interference from other unwanted signals. In microphone sensors, the bandstop filter can have a low frequency cutoff between 20 Hz and 200 Hz and a high frequency cutoff between 4 KHz and 20 KHz. In another implementation, the bandstop filter has a low frequency cutoff not more than 300 Hz and a high frequency cutoff not less than 4 KHz. In acoustic vibration sensors, the low and high frequency cutoffs can be selected within a device-specific linear operating range of the sensor. In one implementation, the low frequency cutoff is not more than 300 Hz and the high frequency cutoff is not less than 3 KHz. More generally, the bandstop filter cutoff frequencies can be selected to optimize sensing of other signals depending on the sensor application.

Figure 8:
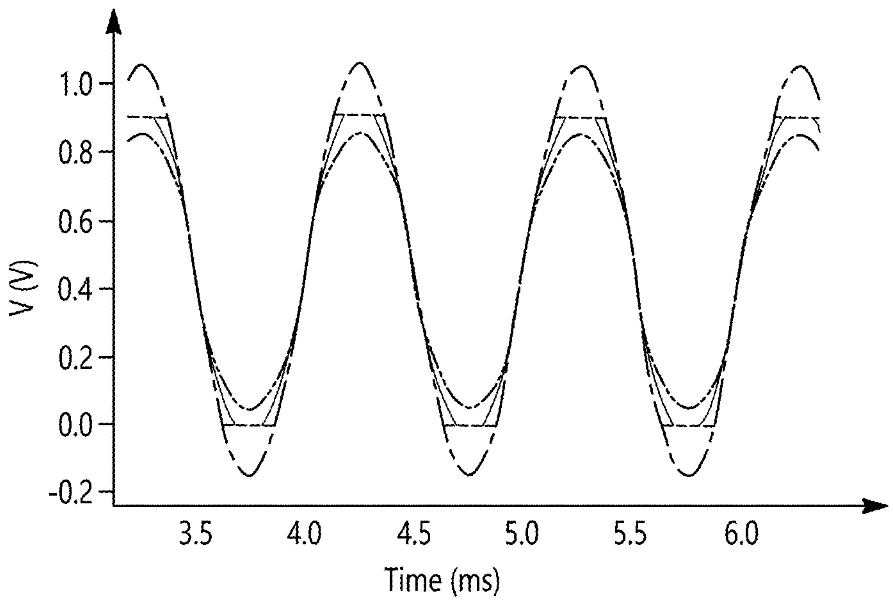
FIG. 8 depicts plots of microphone output signals for different attenuation levels.

FIG. 8 graphically depicts simulated sensor component output signals for various levels of signal attenuation applied to a 600 mVpk (~122 dB SPL) input signal. The DC average is 450 mV and the attenuation threshold is +/−200 mV. At 0 dB attenuation, the output signal is subject to significant clipping resulting in 11.33% total harmonic distortion (THD), above the 10% benchmark for medical hearing devices. At 3 dB SPL attenuation, clipping of the output signal is reduced resulting in 6.484% THD, below the 10% benchmark. At 6 dB SPL attenuation, clipping is eliminated but THD increases to 9.202%. For reference, FIG. 8 shows an undistorted output signal produced by a 0.9 V supply voltage in the absence of clipping.

Figure 9:
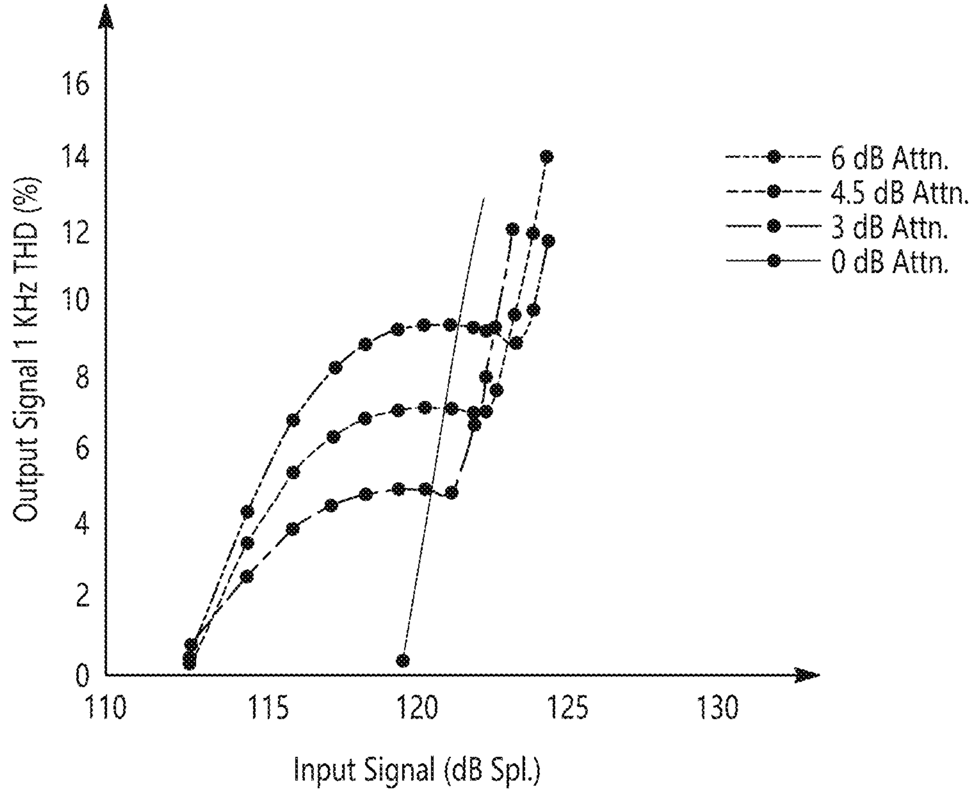
FIG. 9 depicts plots of sensor output signal THD versus input signal sound pressure level (SPL) for different attenuation levels.

FIG. 9 graphically depicts THD of a 1 KHz output signal versus input sound pressure level (dB SPL) for various levels of signal attenuation. At 0 dB attenuation, THD begins to exceed 10% at about 122 dB SPL. At 3 dB attenuation, THD begins to exceed 10% at about 123 dB SPL. At 4.5 dB attenuation, THD begins to exceed 10% at slightly more than 123 dB SPL. At 6 dB attenuation, THD begins to exceed 10% at about 124 dB SPL.

While the disclosure and what is presently considered to be the best mode thereof has been described in a manner establishing possession and enabling those of ordinary skill in the art to make and use the same, it will be understood and appreciated that there are many equivalents to the representative embodiments described herein and that myriad modifications and variations may be made thereto without departing from the scope and spirit of the invention, which is to be limited not by the embodiments described, but by the appended claims and their equivalents.

What is claimed is:

1. A sensor component comprising:

a transducer disposed in a housing;

an electrical circuit disposed in the housing and electrically coupled to the transducer and to an electrical interface on an exterior of the housing, the electrical circuit comprising:

a bias voltage source coupled to a first electrode of the transducer;

a non-inverting amplifier stage having an input coupled to a second electrode of the transducer;

an inverting amplifier stage coupled to an output of the non-inverting amplifier stage;

a negative feedback path between an output of the inverting amplifier stage and the first electrode of the transducer;

a filter configured to filter an electrical signal of the electrical circuit, wherein an electrical output signal of the transducer is attenuated by an attenuation signal applied to the first electrode via the negative feedback path, the attenuation signal based on the filtered electrical signal.

2. The sensor component of claim 1, wherein the filter is a bandpass filter located between the non-inverting amplifier stage and the inverting amplifier stage.

3. The sensor component of claim 2 further comprising a signal detector between the bandpass filter and the inverting amplifier stage, and an attenuation signal actuator that applies the attenuation signal to the transducer based on a signal detected by the signal detector.

4. The sensor component of claim 2, wherein the filter is a bandpass filter having a low frequency cutoff not more than 300 Hz and a high frequency cutoff not less than 4 KHz.

5. The sensor component of claim 2, wherein the filter is a bandpass filter having a low frequency cutoff between 20 Hz and 200 Hz and a high frequency cutoff between 4 KHz and 20 KHz.

6. The sensor component of claim 2, wherein the inverting amplifier stage comprises an inverting amplifier coupled to a driver, and the negative feedback path is between an output of the driver and the transducer.

7. The sensor component of claim 6 further comprising a signal detector at an input of the inverting amplifier stage, and an attenuation signal actuator that applies the attenuation signal based on a signal detected by the signal detector.

8. The sensor component of claim 1, the filter is a bandstop filter between the output of the inverting amplifier stage and the transducer, wherein the attenuation signal predominantly attenuates signals from the transducer at frequencies outside a rejected band of the bandstop filter.

9. The sensor component of claim 8, wherein the bandstop filter has a low frequency cutoff not more than 300 Hz and a high frequency cutoff not less than 4 KHz.

10. A sensor component comprising:

a microelectromechanical systems (MEMS) transducer disposed over a sound port in a housing;

an electrical circuit disposed in the housing and electrically coupled to the MEMS transducer and to an electrical interface on an exterior of the housing, the electrical circuit comprising:

a bias voltage source coupled to a first electrode of the MEMS transducer;

a non-inverting amplifier stage having an input coupled to a second electrode of the MEMS transducer, the input having an impedance greater than 100 TΩ;

an inverting amplifier stage having an input coupled to an output of the non-inverting amplifier stage;

a negative feedback path between an output of the inverting amplifier stage and the first electrode of the MEMS transducer;

a filter configured to filter an electrical signal of the electrical circuit, wherein an electrical output signal of the MEMS transducer is attenuated by an attenuation signal applied to the first electrode via the negative feedback path, the attenuation signal based on the filtered electrical signal.

11. The sensor component of claim 10, wherein the filter is a bandpass filter located between the output of the non-inverting amplifier stage and the input of the inverting amplifier stage.

12. The sensor component of claim 11 is an acoustic sensor, wherein the bandpass filter has a low frequency cutoff not more than 300 Hz and a high frequency cutoff not less than 4 KHz.

13. The sensor component of claim 11, wherein the bandpass filter has a low frequency cutoff between 20 Hz and 200 Hz and a high frequency cutoff between 4 KHz and 20 KHz.

14. The sensor component of claim 12 further comprising a signal detector at the input of the inverting amplifier stage, and an attenuation signal actuator that applies the attenuation signal to the MEMS transducer based on a signal detected by the signal detector.

15. The sensor component of claim 12, wherein the inverting amplifier stage comprises an inverting amplifier coupled to a driver, and the negative feedback path is located between an output of the driver and the MEMS transducer.

16. The sensor component of claim 15 further comprising a signal detector at the input of the inverting amplifier stage, and an attenuation signal actuator that applies the attenuation signal to the MEMS transducer when a signal level detected by the signal detector reaches a threshold.

17. The sensor component of claim 10, the filter is a bandstop filter located between the output of the inverting amplifier stage and the MEMS transducer, wherein the attenuation signal predominantly attenuates signals from the transducer at frequencies outside a rejected band of the bandstop filter.

18. The sensor component of claim 17 is an acoustic sensor, wherein the bandstop filter has a low frequency cutoff between 20 Hz and 200 Hz and a high frequency cutoff between 4 KHz and 20 KHz.

19. The sensor component of claim 17 is an acoustic sensor, wherein the bandstop filter has a low frequency cutoff not more than 300 Hz and a high frequency cutoff not less than 4 KHz.

* * * * *